(12) United States Patent
Crippa et al.

(10) Patent No.: US 7,777,466 B2
(45) Date of Patent: Aug. 17, 2010

(54) VOLTAGE REGULATOR OR NON-VOLATILE MEMORIES IMPLEMENTED WITH LOW-VOLTAGE TRANSISTORS

(76) Inventors: Luca Crippa, Via Manzoni, 66, I-20040 Busnago (MI) (IT); Giancarlo Ragone, Vico 3° Micaré43, I-89047 Roccella Jonica (RC) (IT); Miriam Sangalli, Via XXV Aprile, 11D, I-20061 Carugate (MI) (IT); Giovanni Campardo, Via G. Segantini, 5, I-24100 Bergamo (BG) (IT); Rino Micheloni, Via Luini, 11, I-22978 Turate (CO) (IT)

( * ) Notice: Subject to any disclaimer, the term of this patent is extended or adjusted under 35 U.S.C. 154(b) by 397 days.

(21) Appl. No.: 11/844,470

(22) Filed: Aug. 24, 2007

(65) Prior Publication Data
US 2008/0054864 A1 Mar. 6, 2008

(30) Foreign Application Priority Data
Aug. 24, 2006 (EP) .................................. 06119456

(51) Int. Cl.
G05F 1/40 (2006.01)
(52) U.S. Cl. ...................................................... 323/282
(58) Field of Classification Search ................. 323/268, 323/272, 273, 282, 283, 351
See application file for complete search history.

(56) References Cited
U.S. PATENT DOCUMENTS
5,473,277 A 12/1995 Furumochi
(Continued)

FOREIGN PATENT DOCUMENTS
EP 0576774 1/1994

OTHER PUBLICATIONS
European Search Report from corresponding European Application No. 06119456, filed Aug. 24, 2006.

Primary Examiner—Adolf Berhane
(74) Attorney, Agent, or Firm—Blakely, Sokoloff, Taylor & Zafman LLP (57) ABSTRACT

A voltage regulator integrated in a chip of semiconductor material is provided. The regulator has a first input terminal for receiving a first voltage and an output terminal for providing a regulated voltage being obtained from the first voltage, the regulator including: a differential amplifier for receiving a comparison voltage and a feedback signal being a function of the regulated voltage, and for proving a regulation signal according to a comparison between the comparison voltage and the feedback signal, the differential amplifier having a first supply terminal being coupled with a reference terminal for receiving a reference voltage and a second supply terminal, a regulation transistor having a control terminal for receiving the regulation signal, and a conduction first terminal and a conduction second terminal being coupled through loading means between the reference terminal and the first input terminal of the regulator, the second terminal of the regulation transistor being coupled with the output terminal of the regulator, wherein the second supply terminal of the differential amplifier is coupled with a second input terminal of the regulator for receiving a second voltage being lower than the first voltage in absolute value, and wherein the regulator further includes a set of auxiliary transistors being connected in series between the second terminal of the regulation transistor and the output terminal of the regulator, and control means for controlling the auxiliary transistors according to the regulated voltage.

15 Claims, 11 Drawing Sheets

U.S. PATENT DOCUMENTS

| | | |
|---|---|---|
| 5,631,606 A | 5/1997 | Tran |
| 2003/0042971 A1 | 3/2003 | Oikawa et al. |
| 2005/0088153 A1* | 4/2005 | Suzuki ........................ 323/274 |
| 2007/0222502 A1* | 9/2007 | Noda .......................... 327/541 |

* cited by examiner

VOLTAGE REGULATOR OR NON-VOLATILE MEMORIES IMPLEMENTED WITH LOW-VOLTAGE TRANSISTORS

BACKGROUND OF THE INVENTION

1. Field of the Invention

The present invention relates to the field of semiconductor Integrated Circuits (ICs); more particularly, the invention relates to voltage regulators integrated in chips of semiconductor material.

2. Discussion of the Related Art

ICs can be classified in two broad categories, depending on the magnitude of the voltage differences that occur across the terminals of the electronic components included therein.

More specifically, in ICs belonging to a first category, from now on called "low-voltage ICs", all the electronic components can only withstand (without malfunctioning or breaking thereof voltage differences between their terminals that are limited by a relatively low value—typically equal to the IC power supply voltage (such as 1.8V-3V). For example, those electronic components are low-voltage MOSFETs, which may be subjected to gate oxide breaking or undesired junction's breakdown when voltages exceeding the supply voltage are applied to their terminals (for example, between their gate terminal and any other terminal thereof.

The ICs belonging to a second category, from now on called "high-voltage ICs", instead include electronic components that guarantee the capability of withstanding, at least between a pair of their terminals, higher voltage differences (such as up to 12-14V). For example, those components may be high-voltage MOSFETs, which are designed in such a way to avoid the occurrence of gate oxide breaking or undesired junction's breakdown even when high voltages exceeding the supply voltage are applied to their terminals.

For example, high-voltage ICs are common in the field of memory devices, and especially in non-volatile memories; indeed, in this case high-voltages are generally used to modify the stored data (e.g., to program and/or erase selected memory cells), so that the corresponding circuitry should be implemented with high-voltage components.

The high voltages needed by the non-volatile memories may be provided from the outside, or—more advantageously—they are generated directly on chip. In the latter case, the generation of the high voltages is accomplished by dedicated boosting circuits, like charge pumps, which are capable of generating voltages higher than the IC supply voltage—starting from it. Typically, such boosting circuits are coupled to a voltage regulator, which is used to stabilize the high voltage thus obtained (so as to reduce any possible variation of its value from the desired one). Moreover, the voltage regulator is generally able to modulate the (stabilized) high voltage that is output so making available different values thereof (at most equal to the high voltage received from the boosting circuit). Since the voltage regulator manages the above-mentioned high voltages, it should be implemented with high-voltage components (such as high-voltage MOSFETs).

Generally, the high-voltage MOSFETs have a gate oxide layer thicker than that used for the low-voltage MOSFETs. Indeed, the thicker the gate oxide layer the higher the voltage withstood at the terminals of the MOSFETs (without any undesired breaking). Since the high-voltage MOSFETs occupy more silicon area than the low-voltage MOSFETs, the voltage regulator wastes a significant area of a chip wherein the non-volatile memory is integrated.

Moreover, the non-volatile memory manages low-voltages as well (for example, in its control circuits). For this reason, both low-voltage MOSFETs and high-voltage MOSFETs should be provided.

Such a requirement increases the number of processing steps and masks (for example, for differentiating the oxide thickness of the low-voltage and high-voltage MOSFETs); this has a detrimental impact on the manufacturing process of the non-volatile memory.

SUMMARY OF THE INVENTION

In general terms, the present invention is based on the idea of providing a regulator for high voltages that may be implemented with low-voltage components.

According to one embodiment, a voltage regulator that is integrated in a chip of semiconductor material is provided. The regulator has a first input terminal for receiving a first voltage, and an output terminal for providing a regulated voltage (which is obtained from the first voltage). The regulator includes a differential amplifier. The differential amplifier is adapted to receive a comparison voltage and a feedback signal (being a function of the regulated voltage), and to provide a regulation signal (according to a comparison between the comparison voltage and the feedback signal); the differential amplifier has a first supply terminal (which is coupled with a reference terminal for receiving a reference voltage) and a second supply terminal. The regulator further includes a regulation transistor. The regulation transistor has a control terminal for receiving the regulation signal; moreover, it has a first conduction terminal and a second conduction terminal, which are coupled—through loading means—between the reference terminal and the first input terminal of the regulator. The second terminal of the regulation transistor is coupled with the output terminal of the regulator. The second supply terminal of the comparison amplifier is coupled with a second input terminal of the regulator, for receiving a second voltage that is lower than the first voltage in absolute value. The regulator further includes a set of auxiliary transistors, which are connected in series between the second terminal of the regulation transistor and the output terminal of the regulator. Control means is also provided for controlling the auxiliary transistors according to the regulated voltage.

According to another embodiment, an output transistor with similar auxiliary transistors (connected in series thereto and controlled according to the first voltage) is also provided.

In this way, the differential amplifier and all the transistors may be implemented with low-voltage components.

For example, the transistors are (low-voltage) MOSFETs.

An embodiment of the invention also proposes a specific sequence of operations to be performed for controlling the voltage regulator.

The above-mentioned operations preferably involve the execution of a loop, with the regulated voltage that is increased by a predefined delta value at each iteration thereof.

Typically, the delta value is substantially equal to the second voltage minus a threshold voltage of the transistors.

As a further improvement, a start-up condition of the voltage regulator is enforced at the beginning.

According to another embodiment, a non-volatile memory device including the voltage regulator is provided.

Preferably, the first voltage is a supply voltage of the memory device and the second voltage is a boosted voltage being obtained from the supply voltage.

According to another embodiment, a method for operating the voltage regulator is provided.

According to another embodiment, a software program for performing the method is provided.

DETAILED DESCRIPTION

Figure 1:
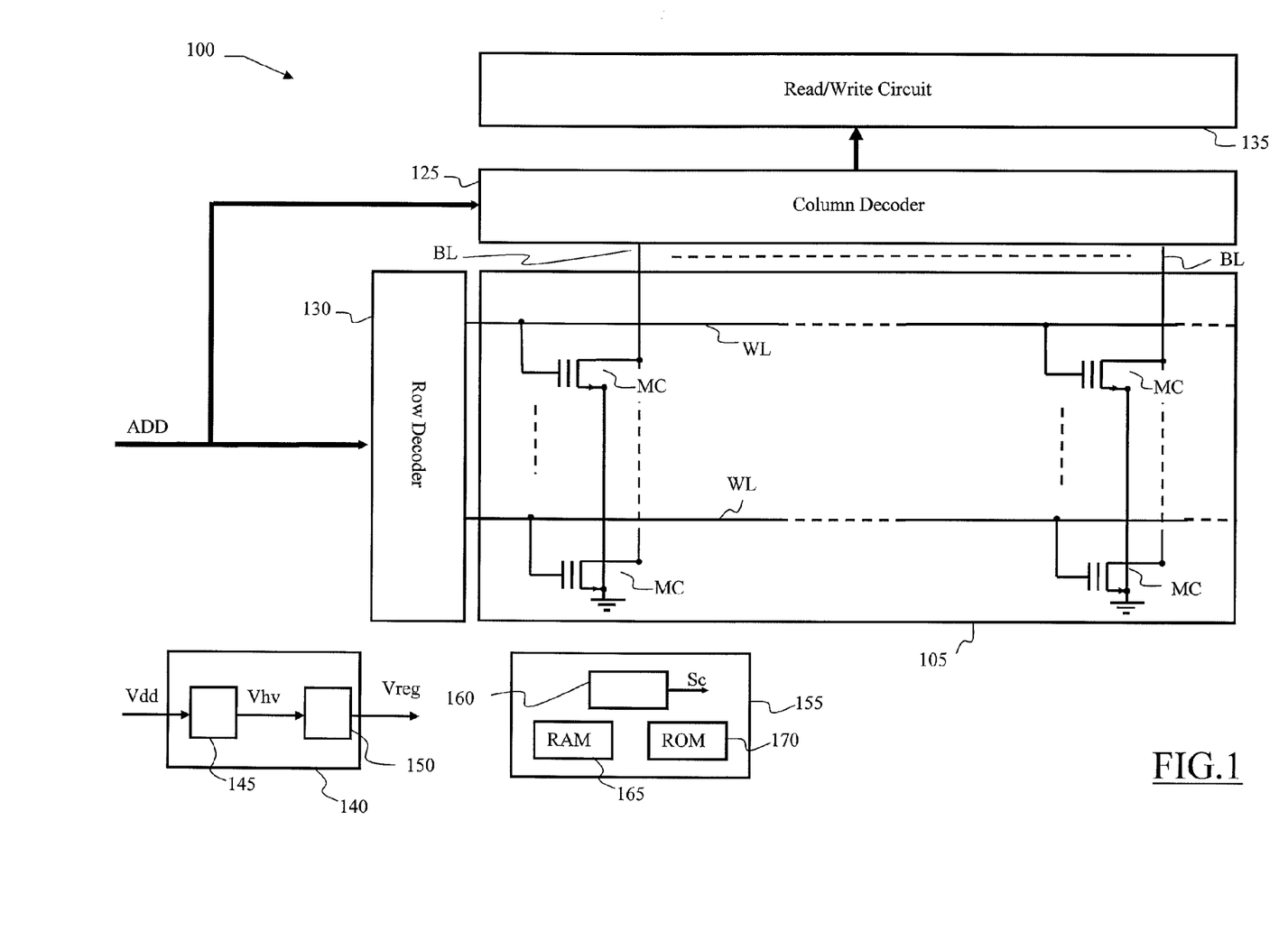
FIG. 1 is a schematic block diagram of a memory device in which the solution according to an embodiment of the invention can be used.

With reference in particular to FIG. 1, a non-volatile memory device 100 is schematically represented. The memory device 100 includes one or more sectors 105 (only one shown in the Figure). The sector 105 includes a plurality of memory cells MC, each one comprising a floating gate MOS transistor. In particular, the memory device 100 is of the flash type, wherein the memory cells MC of the sector 105 should be erased at the same time.

The memory cells MC are arranged in rows and columns. The memory cells MC of each column have the drain terminals connected to a respective bit line BL, while the memory cells MC of each row have the gate terminals connected to a respective word line WL. The source terminals of all the memory cells MC are maintained at a reference voltage GND (or ground).

The memory device 100 receives an addressing code ADD for accessing the memory cells MC. A portion of the addressing code ADD is supplied to a column decoder 125, which selects a set of desired bit lines BL (such as 8). Another portion of the addressing code ADD is supplied to a row decoder 130, which selects one desired word line WL.

The column decoder 125 couples the selected bit lines BL to a read-write circuit 135. The read/write circuit 135 includes all the components (e.g., sense amplifiers, comparators, reference current/voltage generators, pulse generators, program loads, and the like), which are normally required for writing desired logical values into the selected memory cells MC and for reading the logical values currently stored therein. The read/write circuit 135 is coupled with externally accessible terminals of the memory device 100 (not shown in figure) for receiving/delivering data.

The memory device 100 further includes a Power Management Unit 140. The PMU 140 provides the biasing voltages that are used for performing the conventional operations (such as read, program, erase and verify) on the memory device 100. For this purpose, the PMU 140 includes a boosting circuit—typically implemented by a charge pump 145—which receives a supply voltage Vdd of the memory device 100 (such as 1.8-3V) from the outside and outputs different operative voltages Vhv; the operative voltages Vhv are generally higher in absolute value than the supply voltage Vdd (for example, ranging from −9V to 18V). The charge pump 145 is coupled with a voltage regulator 150, which outputs regulated voltages Vreg (being obtained by stabilizing the operative voltages Vhv).

Operation of the flash memory 100 is managed by a micro-controller 155. Particularly, the micro-controller 155 includes a control unit 160 providing control signals (referred to as a whole with Sc), which are used for driving the various components of the memory device 100. The control unit 160 uses a RAM 165 as a working memory. Operation of the control unit 160 is controlled by a low-level software program (or firmware), which is stored in a ROM 170.

Figure 2:
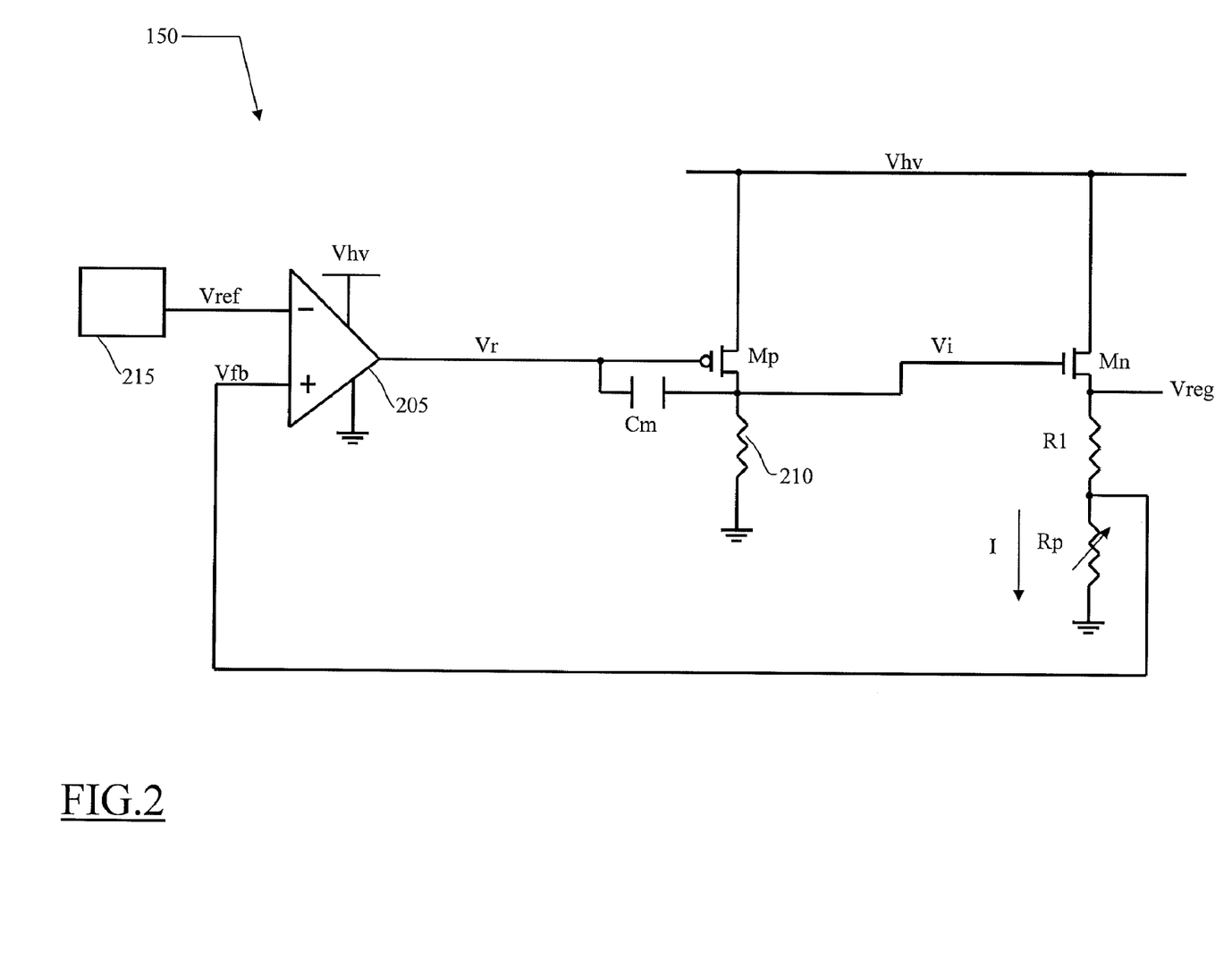
FIG. 2 schematically shows a conventional voltage regulator.

Referring to FIG. 2, a conventional implementation of the voltage regulator 150 is schematically represented. The voltage regulator 150 includes a differential amplifier 205, which is supplied between the ground voltage GND and the operative voltage Vhv. The differential amplifier 205 has a negative input terminal that receives a comparison reference voltage Vref (such as, 1V) from a reference generator 215, and a positive input terminal that receives a feedback signal Vfb (as described in the following). An output terminal of the differential amplifier 205 generates a regulation signal Vr, which is applied to a control terminal of a regulation p-channel MOSFET Mp. The MOSFET Mp has a source terminal that is connected to an input terminal of the voltage regulator 150 (receiving the operative voltage Vhv), and a drain terminal that is connected to a reference terminal (providing the ground voltage GND) through a load resistor 210. A capacitor Cm is connected between the control terminal and the drain terminal of the MOSFET Mp, in order to reduce any fluctuations of the voltage at its drain terminal. The drain terminal of the MOSFET Mp provides an intermediate voltage Vi substantially at the desired value. The intermediate voltage Vi is applied to a control terminal of an output n-channel MOSFET Mn. The MOSFET Mn has a drain terminal that receives the operative voltage Vhv and a source terminal that is connected to a voltage divider. Particularly, the source terminal of the MOSFET Mn is connected to a first terminal of a resistor R1; a second terminal of the resistor R1 is connected to a first terminal of a potentiometer Rp, which has a second terminal connected to the reference terminal. The central tap of the voltage divider (i.e., between the resistor R1 and the potentiometer Rp) provides the feedback signal Vfb, which is returned to the differential amplifier 205. The source terminal of the MOSFET Mn defines an output terminal of the voltage regulator 150, which provides the regulated voltage Vreg; particularly, the MOSFET Mn is connected in a voltage follower configuration so as to transfer the intermediate voltage Vi with reduced output impedance (thereby allowing driving high capacitive loads, not shown in the figure).

During the operation of the voltage regulator 150, a negative feedback is established so that the feedback signal Vfb reaches a value substantially equal to the reference voltage Vref. In such condition, a current I flows through the potentiometer Rp, which current I has a value equal to the ratio between the reference voltage Vref and the resistance of the potentiometer Rp. Such current I also flows through the resistor R1 (since ideally no current flows in the positive input terminal of the differential amplifier 205) and through the MOSFET Mn. As a result, the regulated voltage Vreg is given by the following relation (hereinafter, the electrical quantities will be denoted with the same symbols used for the corresponding circuital elements):

$$Vreg = Vref[(R1/Rp)+1]$$

In such a way, by varying the resistance of the potentiometer Rp, it is possible to set the regulated voltage Vreg to any desired value below the operative voltage Vhv (for example ranging from 1V to 11V). The regulated voltage Vreg is stabilized with respect to any ripples of the operative voltage Vhv (for example, due to thermal phenomena). Indeed, if the operative voltage Vhv increases, the regulated voltage Vreg and the feedback signal Vfb increase accordingly. As a result, the regulation signal Vr increases; therefore, the voltage at the drain terminal of the MOSFET Mp decreases and brings back the regulated voltage Vreg to the desired value (by means of the MOSFET Mn). Similar considerations apply if the operative voltage Vhv decreases.

As it can be noted, the differential amplifier 205 is supplied by the operative voltage Vhv. Moreover, when the regulated voltage Vreg reaches low values (for example, 1-2V) the MOSFETs Mp and Mn receive high-voltages at their terminals. Therefore, in order to guarantee the correct operation of the voltage regulator 150, its components should be implemented by high-voltage MOSFETs.

Figure 3:
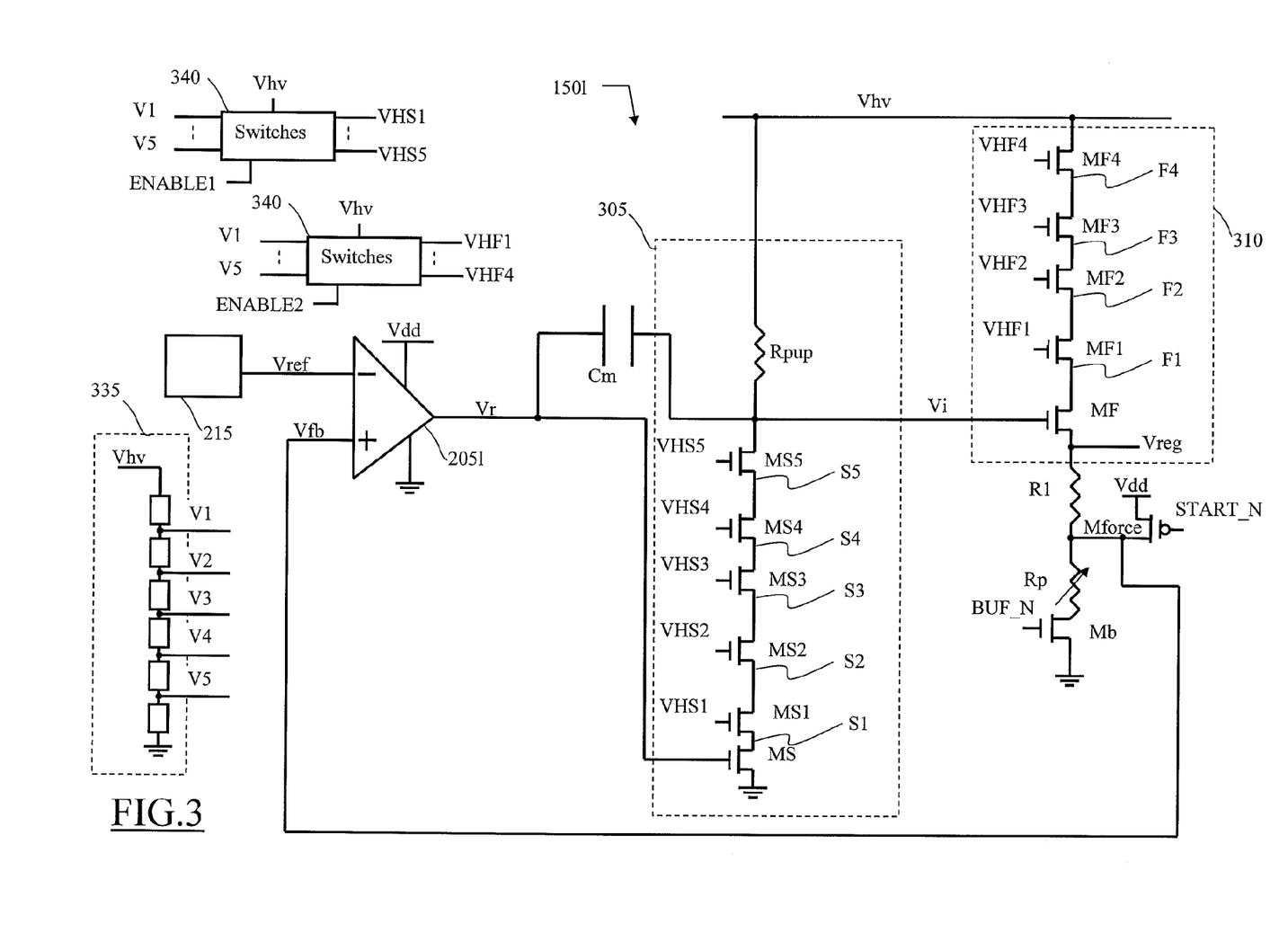
FIG. 3 schematically shows a voltage regulator according to an embodiment of the present invention.

Referring now to FIG. 3, an implementation of the voltage regulator according to an embodiment of the present invention (denoted with 150I) is schematically shown (wherein elements identical or similar to those shown in FIG. 2 are denoted by the same reference numerals).

In this case, the differential amplifier is replaced with an equivalent circuit (denoted with 205I), which is supplied between the supply voltage Vdd and the ground voltage GND (so that is can be implemented by means of low-voltage components only). Moreover, the regulation MOSFET Mp and the output MOSFET Mn are replaced by a regulation circuital block 305 and by an output circuital block 310, respectively.

In addition, the voltage regulator 150I further includes a (low-voltage) P-channel MOSFET Mforce that has a source terminal receiving the supply voltage Vdd, a drain terminal connected to the central tap of the voltage divider R1, Rp and a control terminal receiving a starting signal START_N. Moreover, a (low-voltage) n-channel MOSFET Mb is interposed between the potentiometer Rp and the reference terminal (with its drain terminal and source terminal connected to the potentiometer Rp and to the reference terminal, respectively); the MOSFET Mb has a control terminal that receives an activation signal BUF_N.

In detail, the regulation circuital block 305 includes an n-channel MOSFET MS that has a source terminal connected to the reference terminal, and a control terminal connected to the output terminal of the differential amplifier 205I (thus receiving the regulation signal Vr). The use of the MOSFET MS of the n-type (instead of one of the p-type as in the above described prior art) avoids any breaking thereof even with the low value of the regulation signal Vr (currently limited by the supply voltage Vdd).

One or more (auxiliary) n-type MOSFETs MSi (with i=1.5 in the example at issue) are connected in series to the drain terminal of the MOSFET MS. Particularly, each MOSFET MSi has a source terminal (referred to as node Si) connected to the drain terminal of a preceding MOSFET MSi-1, with the exception of the source terminal of the first MOSFET MS1 that is connected to the drain terminal of the MOSFET MS. The drain terminal of the last MOSFET MS5 is coupled with an input terminal of the voltage regulator 150I (receiving the operative voltage Vhv) through a load resistor Rpup; the drain terminal of the MOSFET MS5 provides the intermediate voltage Vi. Each MOSFET MSi has a control terminal receiving a corresponding control signal VHSi. As it will be apparent in the following, the MOSFETs MSi are controlled so as to avoid their breaking for any value of the intermediate voltage Vi (and then of the regulated voltage Vreg).

Likewise, the output circuital block 310 includes an n-channel MOSFET MF that has a control terminal receiving the intermediate voltage Vi, and a source terminal connected to the output terminal of the voltage regulator 150I (providing the regulated voltage Vreg). One or more (auxiliary) n-type MOSFETs MFj (with j=1.4 in the example at issue) are connected in series to a drain terminal of the MOSFET MF. Particularly, each MOSFET MFj has a source terminal (referred to as node Fj), which is connected to the drain terminal of a preceding MOSFET MFj-1, with the exception of the source terminal of the first MOSFET MF1 that is connected to the drain terminal of the MOSFET MF. The drain terminal of the last MOSFET MF4 directly receives the operative voltage Vhv. Moreover, each MOSFET MFj has a control terminal receiving a corresponding control signal VHFj. As it will be apparent in the following, the MOSFETs MFj are controlled so as to avoid their breaking for any value of the operative voltage Vhv.

The control signals VHS1-VHS5 and VHF1-VHF4 are generated by properly partitioning (through a voltage divider 335) the operative voltage Vhv so as to obtain lower voltages V1-V5. The voltages V1-V5 are then feed to two sets 340 of voltage switches that are adapted to generate (according to the state of corresponding signals ENABLE1 and ENABLE2), the control signals VHS1-VHS5 and VHF1-VHF4, respectively. Preferably, the voltage switches of each set 340 are implemented by means of low-voltage MOSFETs only, as described in the co-pending Patent Application No. EP06111477.3 filed on 21 Mar. 2006, the entire disclosure of which is herein incorporated by reference.

As better described in the following, during the operation of the voltage regulator 150I, the regulated voltage Vreg may take different values, for example ranging from a minimum predetermined value Vmin (in the example at issue, 1V) to a maximum predetermined value Vmax (in the example at issue, 11V). For this purpose, the regulated voltage Vrog is increased from the minimum predetermined value Vmin to the maximum predetermined value Vmax in succession by a delta value $\Delta V$ equal to the supply voltage Vdd minus a threshold voltage Vgs of the MOSFETs (in the example at issue, $\Delta V=3-1=2V$). This feature ensures that during the increase of the regulated voltage Vreg (including any transient periods) each MOSFET is properly biased so as to sustain at its terminals at most the supply voltage Vdd.

When the regulated voltage Vreg reaches low values (down to the minimum value Vmin=1V) the arrangement of the MOSFETs MF, MF1-MF4 ensures that the voltages sustained by each MOSFET MF, MF1-MF4 (at its terminals) are at most equal to the supply voltage Vdd (meaning that the output circuital block 310 only includes low-voltage MOSFETs MF, MF1-MF4).

In particular, the minimum number M of the MOSFETs MFi (connected in series to the MOSFET MF) depends substantially on the operative voltage Vhv (disregarding the minimum value Vmin of the regulated voltage Vreg) and the maximum voltage that may be sustained at the terminals of the MOSFETs MF, MF1-MF4 (that is, the supply voltage Vdd). In particular, in order to avoid any breaking of the MOSFETs MF, MFj the following condition should be met:

$$Vhv \leq (M+1)*Vdd$$

Therefore, the number M of the MOSFETs MFj is given by:

$$M \geq Vhv/Vdd - 1$$

In the example at issue (wherein Vhv=11V and Vdd=3V), we have $M \geq 14/3-1=4$.

Vice-versa, when the regulated voltage Vreg reaches high values (up to the maximum value Vmax=11V) the arrangement of the MOSFETs MS, MS1-MS5 ensures that the voltages sustained by each MOSFET MS, MS1-MS5 (at its terminals) are at most equal to the supply voltage Vdd (meaning that the regulation circuital block 305 only includes low-voltage MOSFETs MS, MS1-MS5).

In particular, the minimum number N of the MOSFETs MSi (connected in series to the MOSFET MS) depends on the maximum value Vmax of the regulated voltage Vreg and the delta value ΔV=Vdd−Vgs (since a MOSFET MSi is required for each increase of the intermediate voltage Vi—and then of the regulated voltage Vreg—by the delta value ΔV). In particular, the following condition should be met:

$$V\max \leq (N+1)*(Vdd-Vgs)$$

Therefore, the number N of the MOSFETs MSi is given by:

$$N \geq V\max/(Vdd-Vgs)-1$$

In the example at issue, we then have N≥11/(3−1)−1=5.

Likewise, the capacitor Cm may be obtained by means of a minimum number J of series-connected low-voltage capacitors (implemented by means of corresponding low-voltage MOSFETs). In this case as well, the number J depends on the maximum value Vmax of the regulated voltage Vreg and the maximum voltage which may be sustained at the terminals of these low-voltage MOSFETs (i.e., the supply voltage Vdd). In particular, the following condition should be met:

$$V\max \leq |J|*Vdd$$

Therefore, the number J of the low-voltage MOSFETs used to implement the capacitor Cm is given by:

$$J \geq V\max/Vdd$$

In the example at issue, we have J≥14/3=5.

Figure 4:
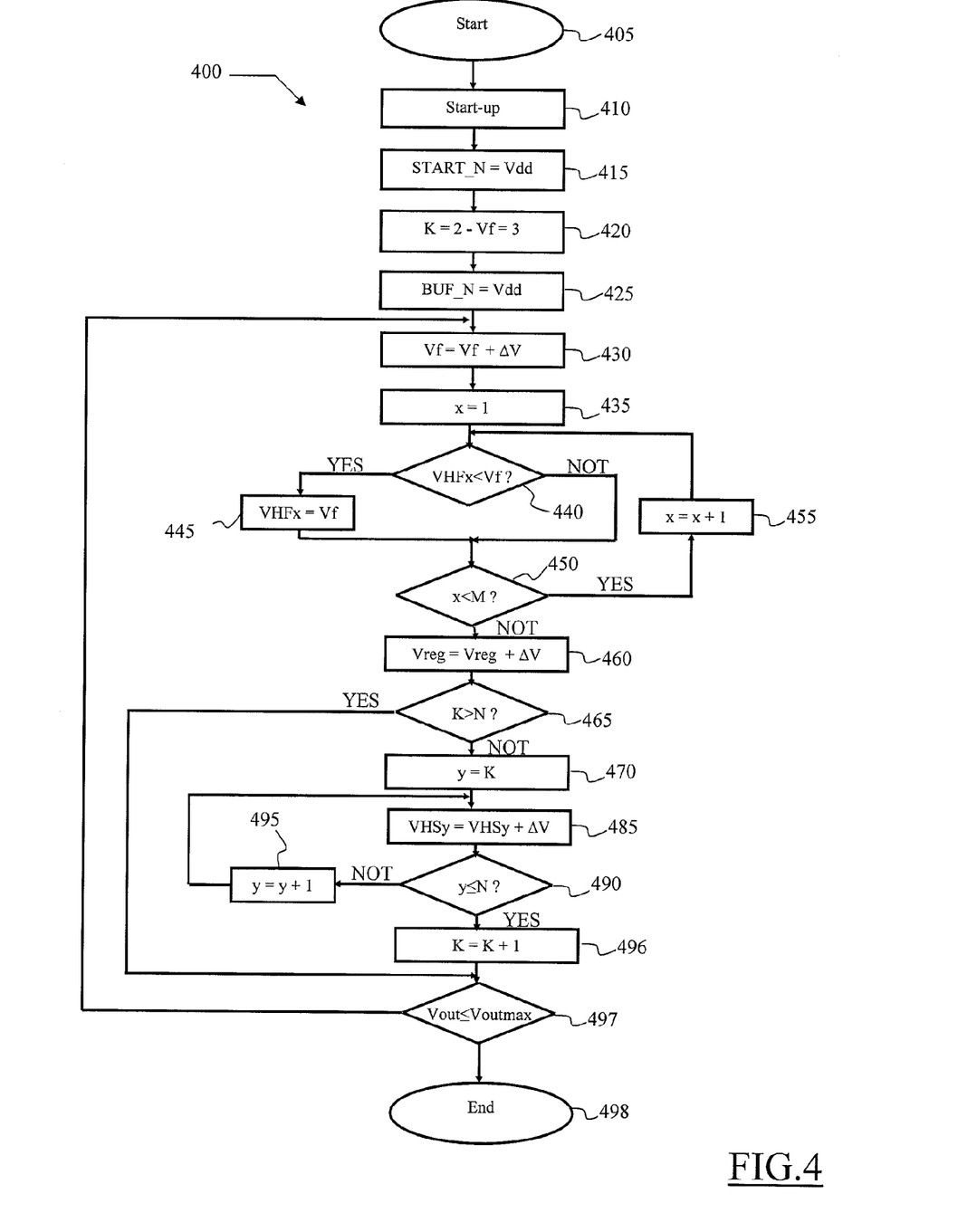
FIG. 4 shows a flow-chart describing the operation of the voltage regulator according to an embodiment of the present invention.

With reference now to FIG. 4, there is shown a method 400 disclosing the operation of the above-described voltage regulator according to an embodiment of the present invention. The method 400 starts at the block 405 and then moves to the block 410. At the beginning, the starting signal START_N and the activation signal BUF_N are at the ground voltage GND; moreover, each control signal VHSi is at the supply voltage Vdd and each control signal VHFj is at a value equal to j*Vdd (in the example at issue, the control signals VHF1-VHF4 are 3V, 6V, 9V and 12V, respectively).

Figure 5A:
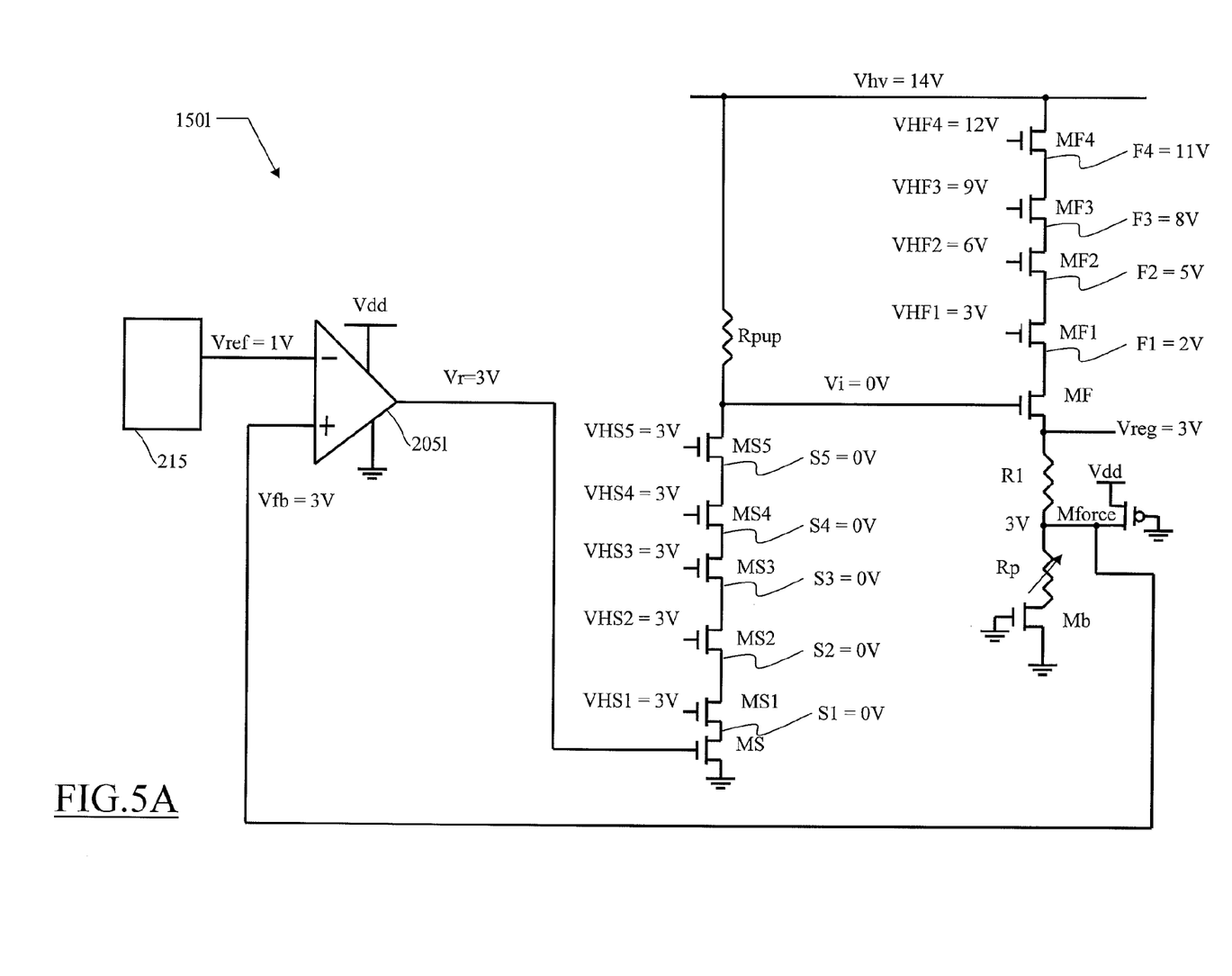
FIGS. 5A-5G schematically show the voltage regulator of FIG. 3 during the operation thereof according to an embodiment of the present invention.

In this condition, as shown in FIG. 5A, the MOSFET Mforce is on. Thus, the voltage at the positive input terminal of the differential amplifier 205I reaches the supply voltage Vdd (i.e., 3V). On the other hand, the differential amplifier 205I has the negative input terminal that receives the reference voltage Vref equal to 1V. In such a way, the regulation voltage Vr reaches the supply voltage Vdd (since the voltage at the positive input terminal of the differential amplifier 205I is significantly higher than the voltage of the negative input terminal thereof). In such biasing condition, the MOSFET MS turns on, and then the MOSFETs MS1-MS5 turn on as well. In such a way, the nodes S1-S5 are brought to the ground voltage GND, with the intermediate voltage V1 that is equal to the ground voltage GND as well. At the same time, the MOSFET Mb is off. Therefore, no current flows through the potentiometer Rp and the resistor R1 so that the regulated voltage Vreg reaches the supply voltage Vdd. The MOSFETs MF, MF1-MF4 are not conductive (since they are series-connected to the resistor R1). In this condition, each node Fj reaches a voltage at least equal to the control signal VHFj minus the threshold voltage of the MOSFET MFj. In the example at issue, the nodes F1-F4 reach the voltages 2V, 5V, 8V and 11V, respectively. This ensures that the operation of the voltage regulator 150I starts from a well-defined condition for its correct functioning.

Returning to FIG. 4, the block 410 is followed by the block 415, wherein the starting signal START_N is brought to the supply voltage Vdd.

Figure 5B:
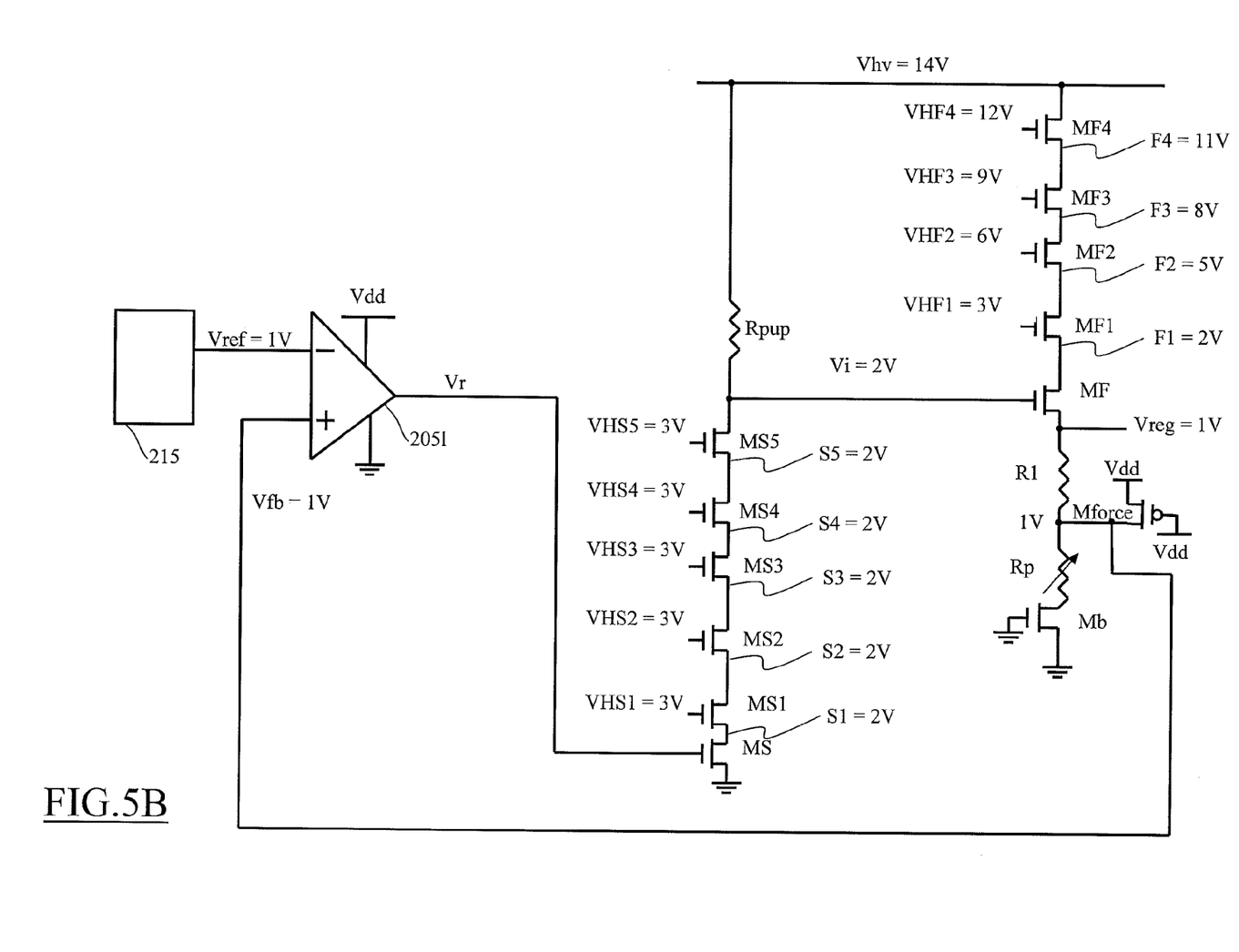

In this condition, as shown in FIG. 5B, the MOSFET Mforce turns off. The negative feedback so established forces the feedback signal Vfb to the same value of the reference voltage Vref (i.e., 1V). Since no current flows through the potentiometer Rp and the resistor R1 (being the MOSFET Mb off) the regulated voltage Vreg reaches the reference voltage Vref as well. The MOSFETs MF, MF1-MF4 are again not conductive (since they are series-connected to the resistor R1), with the nodes Fj that remain at the same voltages of 2V, 5V, 8V and 11V, respectively. In this condition, the control terminal of the MOSFET MF (i.e., the intermediate voltage Vi) reaches at most the regulated voltage Vreg plus the threshold voltage of the MOSFET MF (in the example at issue, 1+1=2V). Therefore, the source terminal of each transistor MSi (i.e., the nodes S1-S5) are brought to the same voltage of 2V.

Returning to FIG. 4, the block 415 is followed by the block 420, wherein two parameters K and Vf are initialized. In particular, the parameter K is set to 2 and the parameter Vf is set to the value of the supply voltage Vdd. Then, the method 400 moves to the block 425, wherein the activation signal BUF_N is brought to the supply voltage Vdd. The method 400 then enters a loop that starts at the block 430, wherein the parameter Vf is increased by the delta value ΔV (in the example at issue, ΔV=2V), that is Vf=3+2=5V. Then, the method 400 moves to the block 435 wherein an index x (used as a counter) is initialized to 1. Thus, the method 400 verifies at the block 440 whether the control signal VHFx (starting from x=1) is lower than the parameter Vf. In the positive case, the control signal VHFx is set to the parameter Vf at the block 445, and the flow of activity descends into block 450; the same point is also reached from block 440 directly otherwise. In any case, a test is performed at the block 450 for determining whether the value of the parameter x is lower than the number M (in the example at issue, M=4). If such condition is verified, the activity flow moves to the block 455, wherein the parameter x is incremented by one. Then, the method returns to the block 440 for reiterating the above described operations (in the example at issue, verifying the values of the control signals VHF2-VHF4). The loop ends when the verification of the block 450 has a negative result (meaning that every MOSFET MFj receives a corresponding control signal VHFj that is at least equal to the value of the parameter Vf). In such case, the method continues to the block 460, wherein the regulated voltage Vreg (starting from 1V) is increased by an amount equal to the delta value ΔV=2V, that is Vreg=1V+2V=3V.

Then, the method 400 moves to the block 465 wherein a test is performed for determining whether the value of the parameter K is higher than the number N (in the example at issue, N=5). If such condition is not verified, the activity flow moves to the block 470, wherein another index y (used as a counter) is initialized to the value of the parameter K (i.e., y=2). The method 400 then passes to the block 485, wherein the control signal VHSy (starting from y=K) is increased by the delta value ΔV=2V. A test is performed at the block 490 for determining whether the value of the index y is lower than or equal to the number N. If such condition is not verified, the method 400 moves at the block 495 wherein the index y is incremented by one. Then the method 400 returns to the block 485 for reiterating the above described operations. In case of positive result, the method 400 moves from the block 490 to the block 496, wherein the parameter K is incremented by one. Then, the method 400 moves to the block 497. The same point is also reached from block 465 directly when the parameter K is higher than the number N. The method 400 then moves to the block 497, wherein it verifies whether the regulated voltage Vreg has reached (or exceeded) the maximum value Vmax. In case of positive result, the method 400 ends at the block 498; vice versa the method 400 returns to the block 430 for reiterating the above described operations.

Figure 5C:
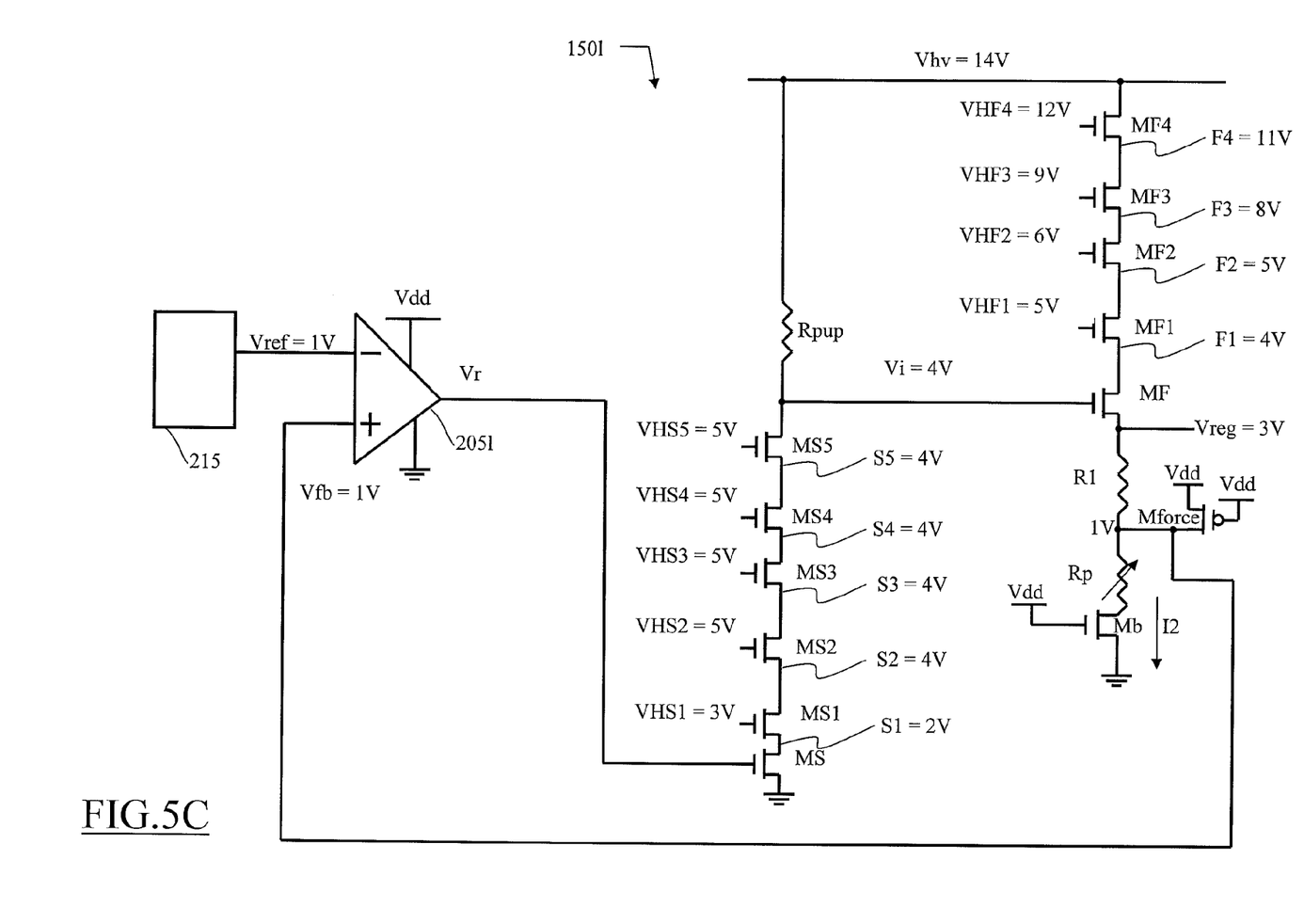

The condition after the first iteration of the loop 430-497 is shown in FIG. 5C. Particularly, the MOSFET Mforce turns off—so as not to affect the feedback loop any longer—and the MOSFET Mb turns on—so that a current now flows through the MOSFET Mb and the potentiometer Rp. At the same time, the control signal VHF1 (being the only one lower than the parameter Vf=5V) is brought to the same voltage of 5V. As above, the negative feedback so established forces the feedback signal Vfb to the same value of the reference voltage Vref (i.e., 1V). The current flowing through the potentiometer Rp also flows through the resistor R1 (no current flows through the MOSFET Mforce because it is off); therefore, by varying the value of the resistance of the potentiometer Rp it is possible to bring the regulated voltage Vreg to the desired value of 1+2=3V. The current from the voltage divider R1, Rp flows through the MOSFETs MF, MF1-MF4 that are then conductive. In such condition, each node Fj reaches a voltage at most equal to the control signal VHFj minus the threshold voltage of the MOSFET MFj. In the example at issue, the nodes F1-F4 reach the voltages 4V, 5V, 8V, 11V, respectively. The intermediate voltage Vi now reaches a voltage at least equal to the regulated voltage Vreg plus the threshold voltage of the MOSFET MF (in the example at issue, 3+1=4V).

Thereafter, the control signals VHS2-VHS5 (being the parameter K=2) are increased by 2V, so as to be brought to 3+2=5V. A corresponding current flows through the load resistor Rpup, and then through the MOSFETs MS, MS1-MS5 (which are again conductive). As a result, each node Si reaches a voltage at most equal to the control signal VHSi minus the threshold voltage of the MOSFETs Msi. In the example at issue, the nodes S1-S5 reach the voltages 2V, 4V, 4V, 4V, 4V, respectively. As can be noted, the choice of the delta value $\Delta V=2V$ ensures that the MOSFET MS5 operates correctly even for any slight fluctuation of the intermediate voltage Vi during the transient period.

Figure 5D:
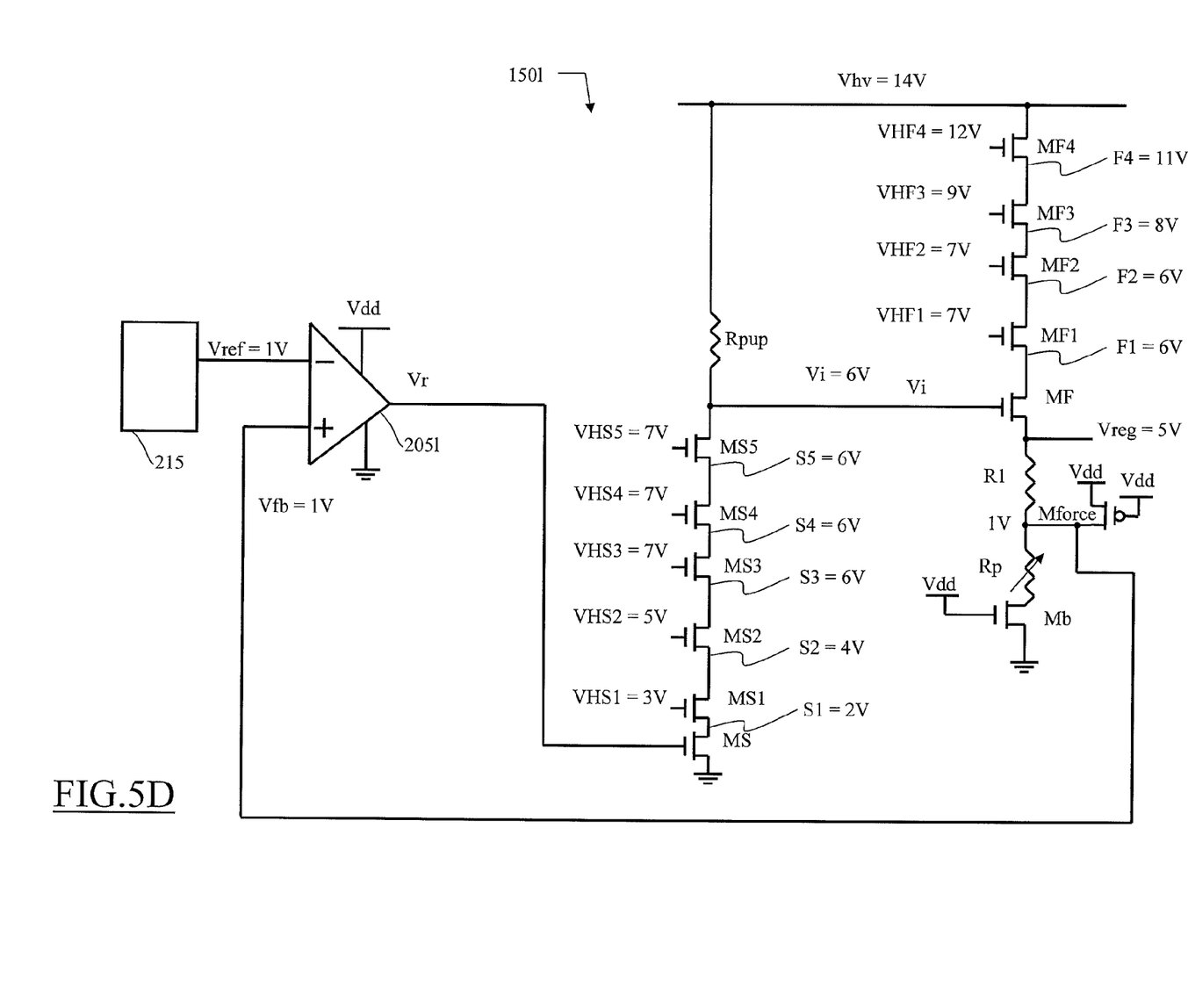

The condition after the second iteration of the loop is shown in FIG. 5D. As above, the parameter Vf is increased to 5+2=7V, and then the control signals VHF1-VHF2 are brought to the same voltage of 7V. The regulated voltage Vreg is now brought to 3+2=5V. The nodes F1-F4 then reach the voltages 6V, 6V, 8V, 11V, respectively and the intermediate voltage Vi now reaches 5+1=6V. The parameter K is increased to 2+1=3, and then the control signals VHS3-VHS5 are increased by 2V, so as to be brought to 5+2=7V. The nodes S1-S5 then reach the voltages 2V, 4V, 6V, 6V, 6V, respectively.

Figure 5E:
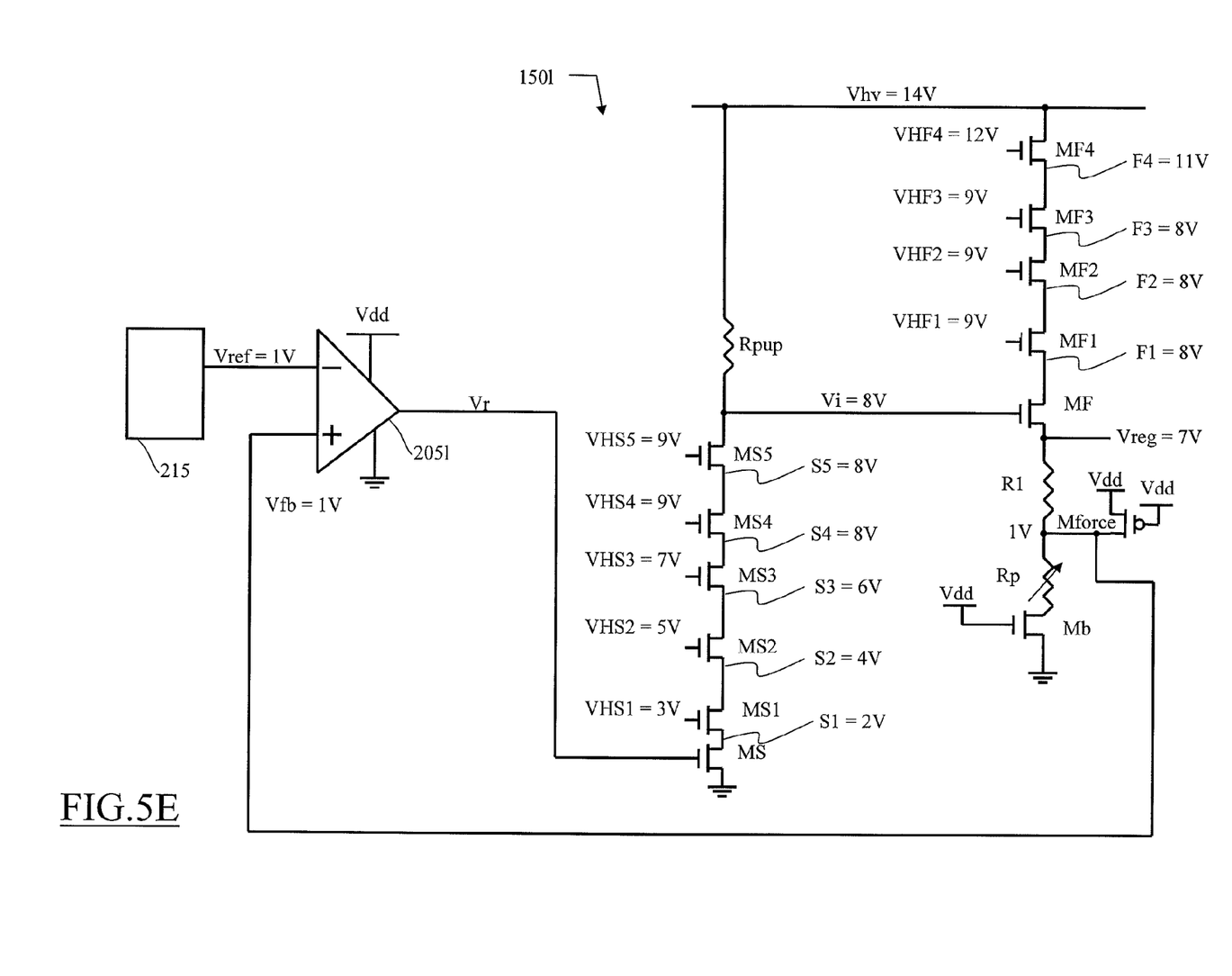

Likewise, at the third iteration of the loop (as shown in FIG. 5E), the parameter Vf is increased to 7+2=9V, and then the control signals VHF1-VHF2 are brought to the same voltage of 9V. The regulated voltage Vreg is now brought to 5+2=7V. The nodes F1-F4 then reach the voltages 8V, 8V, 8V, 11V, respectively and the intermediate voltage V1 now reaches 7+1=8V. The parameter K is increased to 3+1=4, and then the control signals VHS4-VHS5 are increased by 2V, so as to be brought to 9V. The nodes S1-S5 then reach the voltages 2V, 4V, 6V, 8V, 8V, respectively.

Figure 5F:
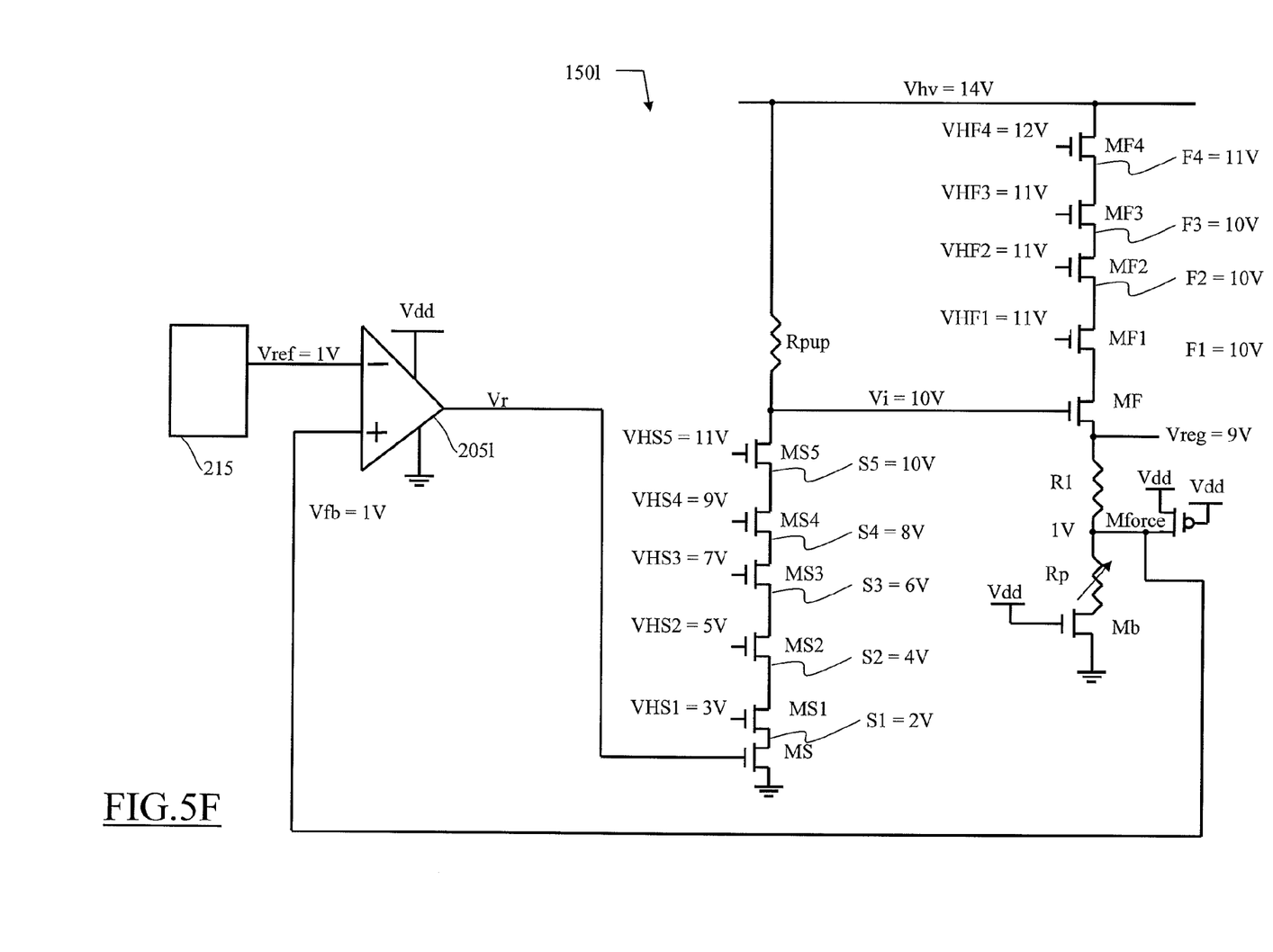

Continuing to FIG. 5F, at the fourth iteration of the loop the parameter Vf is increased to 9+2=11V, and then the control signals VHF1-VHF3 are brought to the same voltage of 11V. The regulated voltage Vreg is now brought to 7+2=9V. The nodes F1-F4 then reach the voltages 10V, 10V, 10V, 11V, respectively and the intermediate voltage Vi now reaches 9+1=10V. The parameter K is increased to 4+1=5, and then the control signal VHS5 is increased by 2V, so as to be brought to 11V. The node S1-S5 then reach the voltages 2V, 4V, 6V, 8V, 10V, respectively.

Figure 5G:
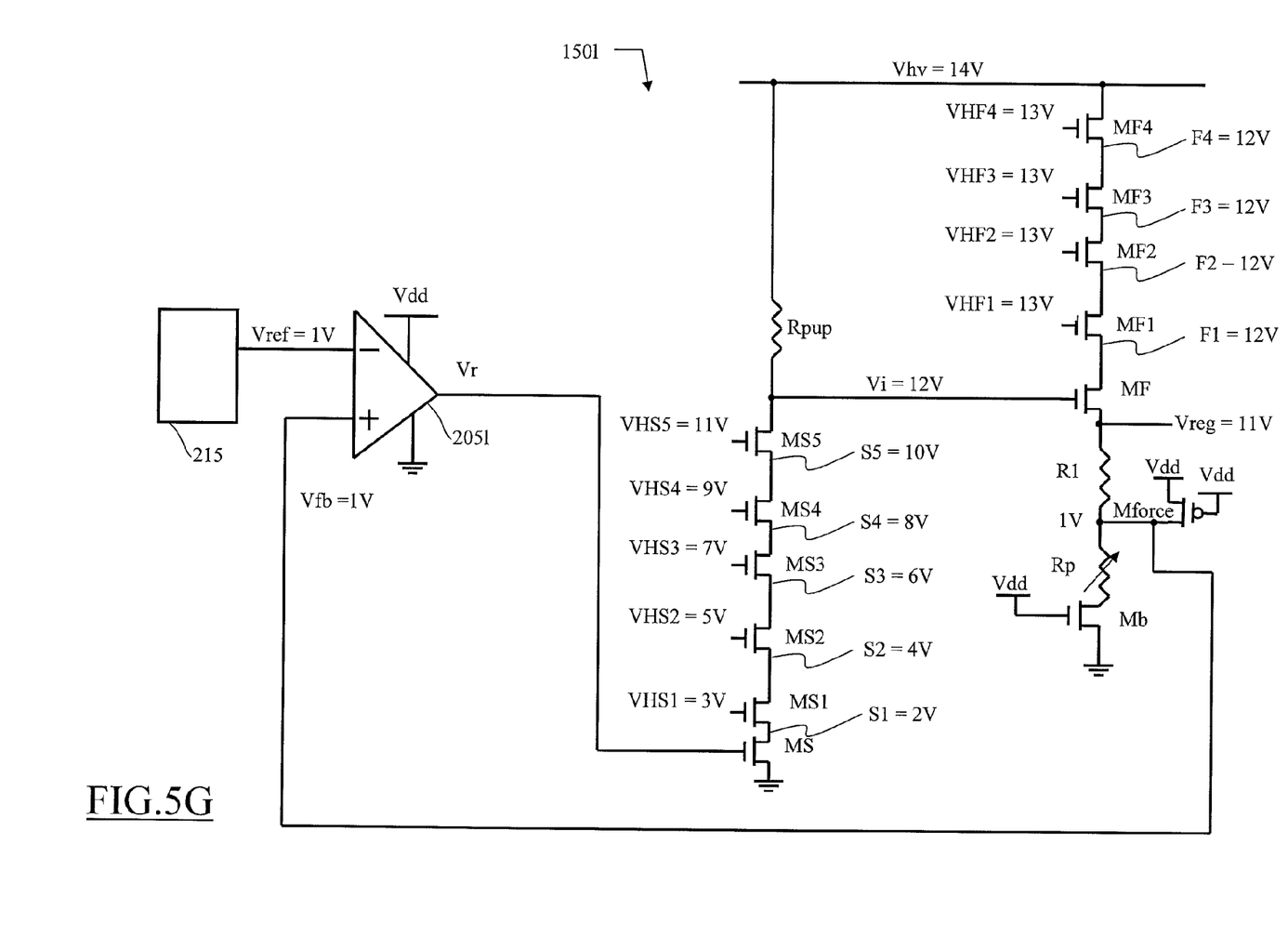

At the end, at the fifth and last iteration of the loop (as shown in FIG. 5G), the parameter Vf is increased to 11+2=13V, and then all the control signals VHF1-VHF4 are brought to the same voltage of 13V. The regulated voltage Vreg is now brought to 9+2=11V (i.e., it reaches the maximum value Vmax defining the exit condition of the loop). All the nodes F1-F4 and the intermediate voltage V1 then reach the same voltage of 12V. The parameter K is increased to 5+1=6, and then no further operation is required for the control signals VHSi—since the condition for dropping the corresponding blocks (i.e., y<N) is satisfied.

In this way, the regulated voltage Vreg may be brought to any desired value (from the minimum value Vmin to the maximum value Vmax), by simply interrupting the above-described iterations of the loop at will. In any case (as in the example at issue, wherein the regulated voltage Vreg is to be brought to the maximum value Vmax), the regulated voltage Vreg is increased in succession by the delta value $\Delta V=2V$ at each iteration of the loop. In this way, as clearly shown in the FIGS. 5A-5G, in every condition all the MOSFETs of the proposed voltage regulator are subjected to voltage differences (between any pair of their terminals) that are at most equal to the supply voltage Vdd (i.e., 3 V); consequently, the whole voltage regulator may be implemented using low voltage MOSFETs only.

Therefore, it is possible to reduce the area of the chip wherein the memory device is integrated.

Moreover, it is now possible to use a single process (based on the processing steps and masks for the low-voltage MOSFETs) for manufacturing the memory device including this voltage regulator; this has a beneficial impact on the manufacturing process of the whole memory device.

Naturally, in order to satisfy local and specific requirements, a person skilled in the art may apply to the solution described above many modifications and alterations. Particularly, although the present invention has been described with a certain degree of particularity with reference to preferred embodiment(s) thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

Particularly, the numerical examples described above are merely illustrative and should not be interpreted in a limitative manner. Moreover, similar considerations apply if the voltage regulator has a different structure or includes equivalent components. In any case, the proposed technique may also be applied to negative voltages (by means of a dual structure).

It should be noted that the same result may also be achieved with a different number of auxiliary transistors for the regulator transistor (down to a single one).

Likewise, the voltage divider may be replaced with any equivalent structure; as above, a different number of auxiliary transistors for the output transistor may be used (down to a single one). In any case, a simplified implementation of the voltage regulator without the above-described output stage is contemplated.

The concepts of the present invention are also applicable to MOSFETs capable of sustaining between each pair of their terminals a voltage difference (slightly) higher than the supply voltage.

Alternatively, it is possible to exchange the p-type and n-type MOSFETs, to replace the MOSFETs with other types of transistors (such as bipolar transistors), or with equivalent electronic components.

Similar considerations apply if the positions of the resistor and of the potentiometer are exchanged in the voltage divider; in any case, a simplified implementation wherein the regulated voltage can take a predefined value only is not excluded.

Although reference has been made to a specific non-volatile memory device, the concepts of the present invention are also applicable to other memory devices (such as multilevel flash memories, EEPROMs or phase-change memories); in any case, the voltage regulator according to the present invention lends itself to be exploited in any other electronic device.

Likewise, the same voltage regulator may be used for regulating whatever voltage.

Moreover, the proposed solution lends itself to be implemented with an equivalent method (by using similar steps, removing some steps being not essential, or adding further optional steps—even in a different order). For example, at the beginning the minimum value for the regulated voltage may be set to a different value (up to the supply voltage) or the control signals may be initialized in a different way; moreover, it is possible to update the control signals with an equivalent algorithm at each iteration of the loop.

In any case, nothing prevents incrementing the regulated voltage at each iteration of the loop by another value (up to the supply voltage).

Alternatively, it is possible to enforce an equivalent startup condition of the voltage regulator; however, this feature is not strictly necessary, and it may be omitted in a simplified implementation of the invention.

Similar considerations apply if the software program (which may be used to implement each embodiment of the invention) causes the micro-controller to perform equivalent operations. In any case, the program may take any form suitable to be used by or in connection with any logic controller. Moreover, it is possible to provide the program on any micro-controller usable medium; the medium can be any element suitable to contain, store, communicate, propagate, or transfer the program. For example, the medium may be of the electronic, magnetic, optical, electromagnetic, infrared, or semiconductor type. In any case, the solution according to the present invention lends itself to be implemented with a hardware structure, or with a combination of software and hardware.

It should be readily apparent that the proposed voltage regulator may be part of the design of an integrated circuit. The design may also be created in a programming language; moreover, if the designer does not fabricate chips or masks, the design may be transmitted by physical means to others. In any case, the resulting integrated circuit may be distributed by its manufacturer in raw wafer form, as a bare die, or in packages form. Moreover, the device may be integrated with other circuits in the same chip, or it may be mounted in intermediate products (such as mother boards). In any case, the integrated circuit is suitable to be used in complex systems (such as computers).

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A voltage regulator integrated in a chip of semiconductor material having a first input terminal for receiving a first voltage and an output terminal for providing a regulated voltage being obtained from the first voltage, the regulator including:

a differential amplifier for receiving a comparison voltage and a feedback signal being a function of the regulated voltage, and for proving a regulation signal according to a comparison between the comparison voltage and the feedback signal, the differential amplifier having a first supply terminal being coupled with a reference terminal for receiving a reference voltage and a second supply terminal, a regulation transistor having a control terminal for receiving the regulation signal, and a first conduction terminal and a second conduction terminal being coupled through loading means between the reference terminal and the first input terminal of the regulator, the second terminal of the regulation transistor being coupled with the output terminal of the regulator, wherein the second supply terminal of the differential amplifier is coupled with a second input terminal of the regulator for receiving a second voltage being lower than the first voltage in absolute value, and wherein the regulator further includes a set of auxiliary transistors being connected in series between the second terminal of the regulation transistor and the output terminal of the regulator, and control means for controlling the auxiliary transistors according to the regulated voltage.

2. The regulator according to claim 1, further including an output transistor having a control terminal being coupled with the second terminal of the regulation transistor through the auxiliary transistors, a first conduction terminal being coupled with the reference terminal through a voltage divider, the first terminal of the output transistor providing the regulated voltage and the voltage divider providing the feedback signal, and a second conduction terminal being coupled with the first input terminal of the regulator through a set of further auxiliary transistors being connected in series, the control means being further adapted to control the further auxiliary transistors according to the first voltage.

3. The regulator according to claim 1, wherein the differential amplifier, and the auxiliary transistors are adapted to withstand at most the second voltage, the control means controlling the auxiliary transistors further according to the second voltage.

4. The regulator according to claim 1, wherein each auxiliary transistor comprises a MOSFET, the first terminal comprising a source terminal and the second terminal comprising a drain terminal.

5. The regulator according to claim 2, wherein the differential amplifier and the further auxiliary transistors are adapted to withstand at most the second voltage the control means controlling the further auxiliary transistors according to the second voltage.

6. The regulator according to claim 2, wherein each further auxiliary transistor comprises a MOSFET, the first terminal comprising a source terminal and the second terminal comprising a drain terminal.

7. The regulator according to claim 2, wherein the voltage divider includes means for selecting the regulated voltage, the control means including means for causing the means for selecting to set the regulated voltage to a minimum value at most equal to the second voltage and for setting a set of control signals for the auxiliary transistors to the second voltage and a set of further control signals for the further auxiliary transistors to values increasing from the second voltage by the second voltage moving away from the output transistor, and means for repeating, until the regulated voltage reaches a chosen target value, the operations of causing the means for selecting to increase the regulated voltage by a delta value at most equal to the second voltage, of setting the further control signals lower than a parameter voltage equal to the regulated voltage plus the delta value to the parameter voltage, and of increasing the control signals by the delta value for the auxiliary transistors from a present one to a last one moving away from the regulation transistor, the present auxiliary transistor being incremented by one at each iteration starting from the second one.

8. The regulator according to claim 7, wherein the delta value is substantially equal to the second voltage minus a threshold voltage of each transistor.

9. The regulator according to claim 7, wherein the control means including means for enforcing a start-up condition of the regulator by forcing the feedback signal to a value at most equal to the second voltage.

10. A non-volatile memory device including the voltage regulator of claim 1.

11. The memory device of claim 10, wherein the second voltage is a supply voltage of the memory device, the memory device further including boosting means for generating the first voltage from the second voltage.

12. A method for operating the voltage regulator of claim 2, comprising:

setting the regulated voltage to a minimum value at most equal to the second voltage, and setting a set of control signals for the auxiliary transistors to the second voltage and a set of further control signals for the further auxiliary transistors to values increasing from the second voltage by the second voltage moving away from the output transistor, and repeating, until the regulated voltage reaches a chosen target value, the operations of:

increasing the regulated voltage by a delta value at most equal to the second voltage, setting the further control signals lower than a parameter voltage equal to the regulated voltage plus the delta value to the parameter voltage, and increasing the control signals by the delta value for the auxiliary transistors from a present one to a last one moving away from the regulation transistor, the present auxiliary transistor being incremented by one at each iteration starting from the second one.

13. The method according to claim 12, wherein the delta value is substantially equal to the second voltage minus a threshold voltage of each transistor.

14. The method according to claim 12, further including the step of: enforcing a start-up condition of the regulator by forcing the feedback signal to a value at most equal to the second voltage.

15. A software program for performing the method of claim 12 when the software program is executed on a logic controller.

* * * * *